United States Patent
Chen et al.

(10) Patent No.: US 11,145,751 B2
(45) Date of Patent: Oct. 12, 2021

(54) SEMICONDUCTOR STRUCTURE WITH DOPED CONTACT PLUG AND METHOD FOR FORMING THE SAME

(71) Applicant: Taiwan Semiconductor Manufacturing Co., Ltd., Hsinchu (TW)

(72) Inventors: Kuo-Ju Chen, Taichung (TW); Su-Hao Liu, Jhongpu Township, Chiayi County (TW); Chun-Hao Kung, Hsinchu (TW); Liang-Yin Chen, Hsinchu (TW); Huicheng Chang, Tainan (TW); Kei-Wei Chen, Tainan (TW); Hui-Chi Huang, Zhubei (TW); Kao-Feng Liao, Hsinchu (TW); Chih-Hung Chen, Hsinchu (TW); Jie-Huang Huang, Taoyuan (TW); Lun-Kuang Tan, Hsinshu (TW); Wei-Ming You, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/939,389

(22) Filed: Mar. 29, 2018

(65) Prior Publication Data

US 2019/0305107 A1    Oct. 3, 2019

(51) Int. Cl.
*H01L 29/66* (2006.01)
*H01L 29/417* (2006.01)
*H01L 29/78* (2006.01)

(52) U.S. Cl.
CPC .... *H01L 29/6681* (2013.01); *H01L 29/41791* (2013.01); *H01L 29/785* (2013.01)

(58) Field of Classification Search
CPC .............. H01L 29/6681; H01L 29/785; H01L 29/41791
See application file for complete search history.

(56) References Cited

U.S. PATENT DOCUMENTS

| | | | |
|---|---|---|---|
| 2012/0068273 A1* | 3/2012 | Fischer | H01L 29/7845 257/369 |
| 2014/0124842 A1* | 5/2014 | Wang | H01L 29/7848 257/288 |
| 2016/0233334 A1* | 8/2016 | Shin | H01L 29/161 |
| 2018/0151677 A1* | 5/2018 | Glass | H01L 29/0653 |

* cited by examiner

*Primary Examiner* — Moazzam Hossain
*Assistant Examiner* — Hajar Kolahdouzan
(74) *Attorney, Agent, or Firm* — McClure, Qualey & Rodack, LLP

(57) ABSTRACT

A semiconductor structure and a method for forming the same are provided. The semiconductor structure includes a gate structure, a source/drain structure, a dielectric layer, a contact plug. The gate structure is positioned over a fin structure. The source/drain structure is positioned in the fin structure and adjacent to the gate structure. The dielectric layer is positioned over the gate structure and the source/drain structure. The contact plug is positioned passing through the dielectric layer. The contact plug includes a first metal compound including one of group III elements, group IV elements, group V elements or a combination thereof.

20 Claims, 10 Drawing Sheets

SEMICONDUCTOR STRUCTURE WITH DOPED CONTACT PLUG AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. The advantages of the FinFET may include a reduction of the short channel effect, reduced leakage, and a higher current flow.

However, since feature sizes continue to decrease, fabrication processes continue to become more difficult to perform. Therefore, it is a challenge to form a reliable semiconductor structure including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
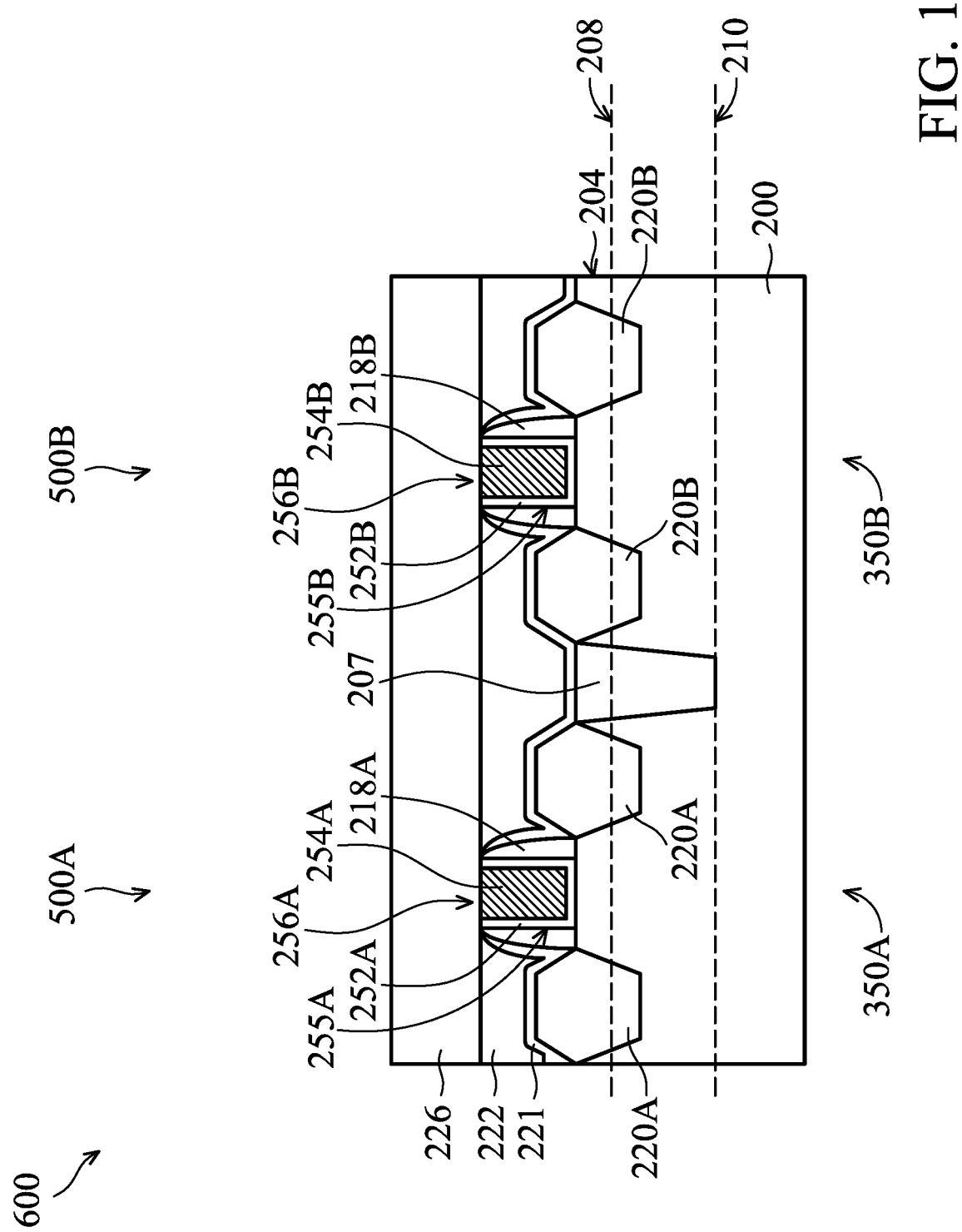
FIGS. 1A-1J are cross-sectional views of various stages of a process for forming a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of a semiconductor structure and a method for forming the same are provided. FIGS. 1A-1J are cross-sectional views of various stages of a process for forming a semiconductor structure 600, in accordance with some embodiments. It should be noted that the cross-sectional views of the semiconductor structure are taken along the longitudinal direction (the channel length direction of a FinFET) of a fin structure (e.g. a fin structure 204) of the semiconductor structure.

In some embodiments, a gate-replacement (gate-last) process is employed to fabricate the semiconductor structures 600, such as a fin field effect transistor (FinFET) (e.g. FinFETs 500A and 500B).

As shown in FIG. 1A, a substrate 200 including a fin structure 204 is received. In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 200 has a first region 350A and a second region 350B. The second region 350B may be adjacent to the first region 350A. The first region 350A may be for forming N-type devices, such as N-type metal-oxide-semiconductor field-effect transistors (MOSFETs) (e.g. the FinFET 500A). The second region 350B may be for forming P-type devices, such as P-type metal-oxide-semiconductor field-effect transistors (MOSFETs) (e.g. the FinFET 500B). Therefore, the first region 350A may be referred to as an NMOS region and the second region 350B may be referred to as a PMOS region.

In some embodiments, the fin structure 204 is formed by performing a patterning process on the substrate 200. The fin structure 204 may include a first isolation region 207 (e.g. shallow trench isolation (STI)) filled in a first trench (not shown) in the fin structure 204. In addition, the fin structure 204 may be surrounded by second trenches (not shown) formed in the substrate 200 by the patterning process. Second isolation regions (not shown) (e.g. shallow trench isolation (STI) structures) may be formed on a bottom surface 210 of each of the trenches. A lower portion of the fin structure 204 is surrounded by the isolation structures, and an upper portion of the fin structure 204 protrudes from a top surface 208 of each of the second isolation structures.

After the isolation regions are formed, dummy gate structures (not shown) are formed over a top surface 205 of the fin structure 204. In addition, hard mask layers are formed on the dummy gate structures. In some embodiments, the dummy gate structures cover respective channel regions of the resulting finFETs (e.g. the FinFETs 500A and 500B) on the fin structure 204. In addition, the dummy gate structures may be separated from each other by the first isolation region 207. In some embodiments, the dummy gate structures cover the top surface 205 and sidewalls of the fin structure 204, and extend over the isolation region and the substrate 200 outside the fin structure 204. In some embodiments, each of the dummy gate structures includes a gate dielectric (not shown) and a gate electrode (not shown) formed over the gate dielectric.

Afterwards, gate spacers 218A and 218B are formed on opposite sidewalls of the dummy gate structure and over the fin structure 204, as shown in FIG. 1A in accordance with some embodiments. The gate spacers 218A and 218B may include a single layer structure or a multi-layer structure. The gate spacer spacers 218A and 218B may be made of low dielectric constant (low-k) materials (e.g. k<5), such as silicon oxide, silicon nitride, silicon oxynitride, silicon carbide, silicon carbonitride, another suitable material, or a combination thereof. In some embodiments, the gate spacers 218A and 218B are formed by a deposition process and a subsequent etching process. The deposition process may include a chemical vapor deposition (CVD) process, a physical vapor deposition (PVD) process, a spin-on process, another applicable process, or a combination thereof. The etching process may include a dry etch process.

After the gate spacers 218A and 218B are formed, source/drain structures 220A and 220B are formed in portions of the fin structure 204 that is not covered by the dummy gate structures and the gate spacers 218A and 218B, as shown in FIG. 1A in accordance with some embodiments. The source/drain structures 220A and 220B may be formed in the fin structure 204 and adjacent to the gate spacers 218A and the gate spacers 218B. In addition, the source/drain structures 220A are separated from the source/drain structures 220B by the first isolation region 207.

In some embodiments, the source/drain structures 220A and 220B may include a strain material to apply stress to the channel region. For example, the source/drain structures 220 are formed of Ge, SiGe, InAs, InGaAs, InSb, GaAs, GaSb, InAlP, InP, or the like. In some embodiments, the lattice constant of the source/drain structures 220A and 220B are different from the lattice constant of the fin structure 204. In some embodiments, the source/drain structures 220A and 220B have a diamond shape. In addition, the bottoms of the source/drain structures 220A and 220B may be positioned below the top surface 208 of each of the isolation structures surrounding the fin structure 204.

The source/drain structures 220A and 220B may be formed by an etching process and a subsequent filling process. The etching process is performed to form recesses (not shown) adjacent the gate spacers 218A and 218B and in the fin structure 204. In some embodiments, the etching process is a dry etching process. In some embodiments, the filling process (not shown) is performed by filling the recesses with one or more strained semiconductor materials to form the source/drain structures 220A and 220B. In some embodiments, the filling process includes an epitaxial process, such as a selective epitaxial growth (SEG) process, CVD deposition techniques (e.g. vapor-phase epitaxy (VPE) and/or ultra-high vacuum CVD (UHV-CVD)), molecular beam epitaxy, or another suitable epitaxial process.

After the source/drain structures 220A and 220B are formed, a contact etch stop layer (CESL) 221 is conformally deposited over the source/drain structures 220A and 220B and the gate spacers 218A and 218B by a thin film deposition process, as shown in FIG. 1A in accordance with some embodiments. The CESL 221 may serve as an etch stop layer of the subsequent etching process configured to form source/drain contact holes (not shown). In some embodiments, the CESL 221 may be a single layer or multiple layers. The CESL 221 may be made of silicon carbide (SiC), silicon nitride ($Si_xN_y$), silicon carbonitride (SiCN), silicon oxycarbide (SiOC), silicon oxycarbon nitride (SiOCN), tetraethoxysilane (TEOS) or another applicable material. In some embodiments, the CESL 221 has a bi-layer structure which includes a TEOS layer formed on a SiC layer. A TEOS layer has better moisture prevention than a SiC layer. In addition, a SiC layer is used as a glue layer to improve adhesion between the underlying layer and the TEOS layer. In some embodiments, the CESL 221 is formed by performing a plasma enhanced chemical vapor deposition (CVD) process, a low pressure CVD process, an atomic layer deposition (ALD) process, or another applicable process.

After the CESL 221 is formed, a dielectric layer 222 (such as a first inter-layer dielectric (ILD) layer) is formed over the fin structure 204, the dummy gate structures, the gate spacers 218A and 218B, and the source/drain structures 220A and 220B, as shown in FIG. 1A in accordance with some embodiments. The dielectric layer 222 may be formed over the CESL 221 and may fill gaps between the dummy gate structures. In some embodiments, the dummy gate structures are surrounded by the dielectric layer 222.

In some embodiments, a deposition process is performed to form the dielectric layer 222 over the CESL 221. Afterwards, a planarization process is performed to level the top surfaces of CESL 221, the dielectric layer 222, the gate spacers 218A and 218B, and the dummy gate structures.

In some embodiments, the dielectric layer 222 is made of a dielectric material such as silicon oxide, phosphosilicate glass (PSG), borosilicate glass (BSG), boron-doped phosphosilicate Glass (BPSG), undoped silicate glass (USG), carbon-doped silicate glass, silicon nitride or silicon oxynitride. In some embodiments, the dielectric layer 222 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon dioxide ($SiO_2$). In some embodiments, ELK dielectric material is deposited by a plasma enhanced chemical vapor deposition (PECVD) process or by a spin coating process.

In some embodiments, the deposition process of the dielectric layer 222 includes a plasma enhanced chemical vapor deposition (CVD) process, a low pressure CVD process, an atomic layer deposition (ALD) process, flowable CVD (FCVD process), a spin-on coating process, or another applicable process. In some embodiments, the planarization process of the dielectric layer 222 includes a chemical mechanical polishing (CMP) process, a grinding process, an etching process, another applicable process, or a combination thereof.

After the dielectric layer 222 is formed, gate structures 256A and 256B are formed to replace the dummy gate structure by a removal process, a deposition processes and a subsequent planarization process, as shown in FIG. 1A in accordance with some embodiments. In some embodiments, the gate structure 256A surrounded by the gate spacers 218A includes a gate dielectric layer 252A and a gate electrode layer 254A over the gate dielectric layer 252A. Similarly, the gate structure 256B surrounded by the gate spacers 218B may include a gate dielectric layer 252B and a gate electrode layer 254B over the gate dielectric layer 252B. The source/drain structures 220A and 220B may be positioned adjacent to the gate structures 256A and 256B. In some embodiments, the gate spacers 218A are positioned on opposite sidewall surfaces 255A of the gate structure 256A. The gate spacers 218B may be positioned on opposite sidewall surfaces 255B of the gate structure 256B.

In some embodiments, the gate dielectric layers 256A and 256B include a single layer or multiple layers. In some embodiments, the gate dielectric layers 256A and 256B have a U-shape or a rectangular shape. In some embodiments, the gate dielectric layers 256A and 256B are formed of silicon oxide, silicon nitride, or a high-k dielectric material (k>7.0) including a metal oxide or a silicate of Hf, Al, Zr, La, Mg, Ba, Ti, Pb, or a combination thereof. The formation methods of gate dielectric layers 256A and 256B may include molecular beam deposition (MBD), atomic layer deposition (ALD), plasma enhanced CVD (PECVD), and the like.

In some embodiments, the gate electrode layers 254A and 254B are made of a metal-containing material such as TiN, TaN, TaC, Co, Ru, Al, combinations thereof, or multi-layers thereof, and are formed by a deposition process, such as electroplating, electroless plating, or another suitable method.

In some embodiments, a work function layer (not shown) may be formed in the gate structures 256A and 256B. The work function layer may include an N-type work-function layer or a P-type work-function layer. The P-type work function layer may include TiN, TaN, Ru, Mo, Al, WN, $ZrSi_2$, $MoSi_2$, $TaSi_2$, $NiSi_2$, WN, another suitable P-type work function material, or a combination thereof. The N-type work function layer may include Ti, Ag, TaAl, TaAlC, TiAlN, TaC, TaCN, TaSiN, Mn, Zr, another suitable N-type work function material, or a combination thereof. In some embodiments, as shown in FIG. 1A, the work function layer in the gate structures 256A may include the N-type work-function layer, and the gate structure 256B may include the P-type work-function layer.

Afterward, a dielectric layer (e.g. a second inter-layer dielectric (ILD) layer)) 226 is formed over the dielectric layer 222 and the gate structures 256A and 256B, as shown in FIG. 1A in accordance with some embodiments. For example, the dielectric layer 226 may be a flowable film formed by a flowable CVD method. In some embodiments, the dielectric layer 226 is formed of a dielectric material such as PSG, BSG, BPSG, USG, or the like, and may be deposited by any suitable method, such as CVD and PECVD.

Figure 1B:
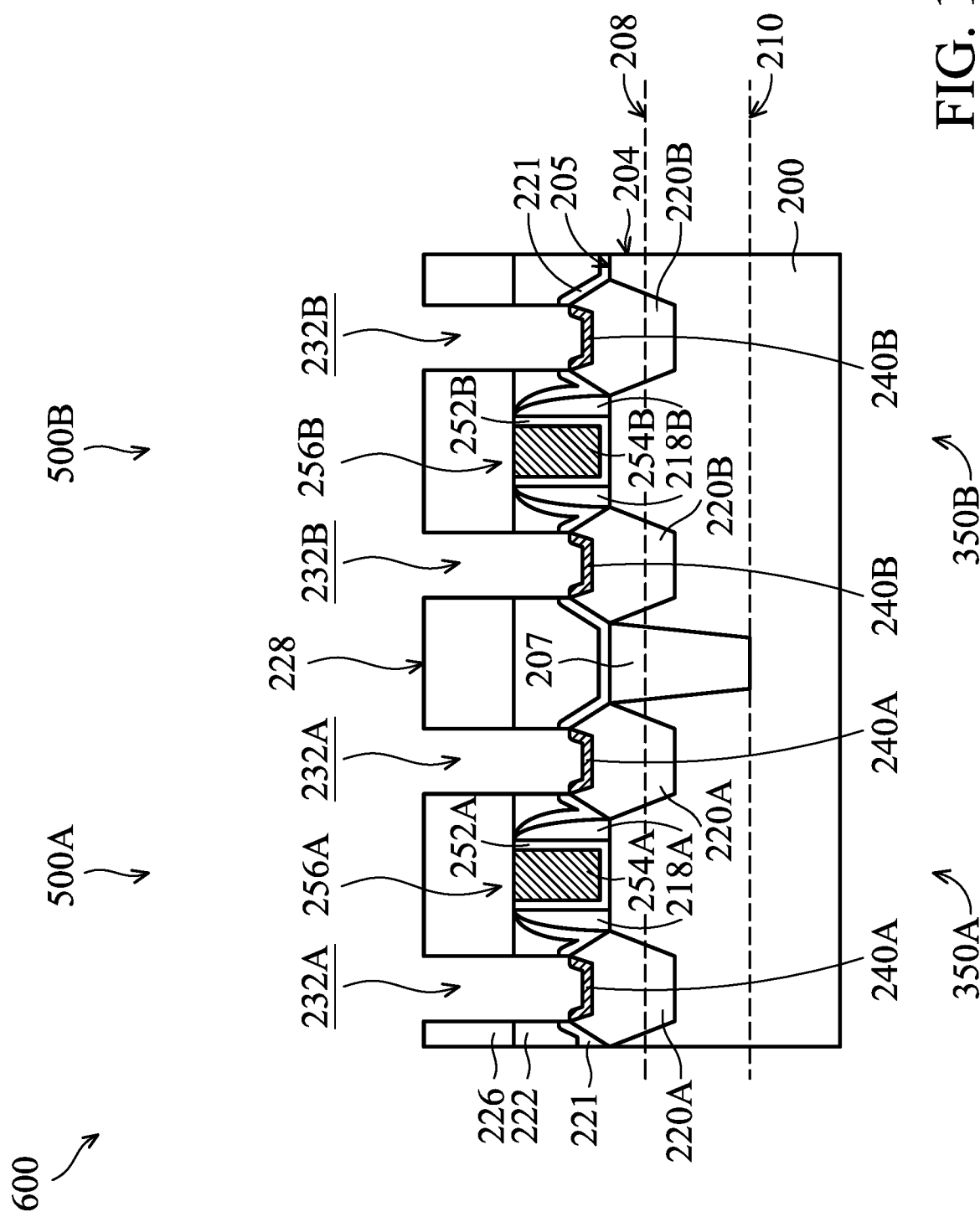

After the dielectric layer 226 is formed, openings 232A and 232B in the dielectric layers 222 and 226 by a patterning process, as shown in FIG. 1B in accordance with some embodiments. The patterning process may be performed to remove portions of the dielectric layers 222 and 226 and the CESL 221 to form the openings 232A and 232B and to stop on the source/drain structures 220A and 220B. Therefore, the openings 232A and 232B are formed passing through the dielectric layers 222 and 226 and the CESL 221 to expose the source/drain structures 220A and 220B.

In some embodiments, the patterning process of the openings 232A and 232B include a photolithography processes and a subsequent etching process. The photolithography process may include photoresist coating (e.g. spin-on coating), soft baking, mask aligning, exposure, post-exposure baking, developing the photoresist, rinsing and drying (e.g. hard baking). In some embodiments, the etching process is a dry etching process. In addition, etching gases used in the etching process 360 include fluorine-containing (F-containing) gases. After the openings 232A and 232B are formed, the mask layer 230 may be removed by etching or any other suitable method.

Afterward, source/drain silicide layers 240A and 240B are formed on the source/drain structures 220A and 220B by a silicidation process, as shown in FIG. 1B in accordance with some embodiments. In some embodiments, the silicidation process includes a metal material deposition process and an annealing process performed in sequence. In some embodiments, the deposition process of the silicidation process includes a physical vapor deposition (PVD) process, an atomic layer deposition (ALD) process, or another applicable process. In some embodiments, the annealing process of the silicidation process is performed at a temperature in a range from about 300° C. to about 800° C. After the annealing process, the unreacted metal material is removed.

In some embodiments, the source/drain silicide layers 240A and 240B are formed of one or more of cobalt silicide (e.g. CoSi, $CoSi_2$, $Co_2Si$, $Co_2Si$, $Co_3Si$; collectively "Co silicide"), titanium silicide (e.g. $Ti_5Si_3$, TiSi, $TiSi_2$, $TiSi_3$, $Ti_6Si_4$; collectively "Ti silicide"), nickel silicide (e.g. $Ni_3Si$, $Ni_{31}Si_{12}$, $Ni_2Si$, $Ni_3Si_2$, NiSi, $NiSi_2$; collectively "Ni silicide"), copper silicide (e.g. $Cu_{17}Si_3$, $Cu_{56}Si_{11}$, $Cu_5Si$, $Cu_{33}Si_7$, $Cu_4Si$, $Cu_{19}Si_6$, $Cu_3Si$, $Cu_4Si_{13}$; collectively "Cu silicide"), tungsten silicide ($W_5Si_3$, $WSi_2$; collectively "W silicide"), and molybdenum silicide (Mo$_3$Si, Mo$_5$Si$_3$, MoSi$_2$; collectively "Mo silicide").

Afterward, a glue layer material 242 is formed covering a top surface 228 of the dielectric layer 226 and sidewall surfaces of the openings 232A and 232B. The glue layer material 242 is formed covering the source/drain structures 220A and 220B in the openings 232A and 232B, as shown in FIG. 1C in accordance with some embodiments.

Figure 1C:
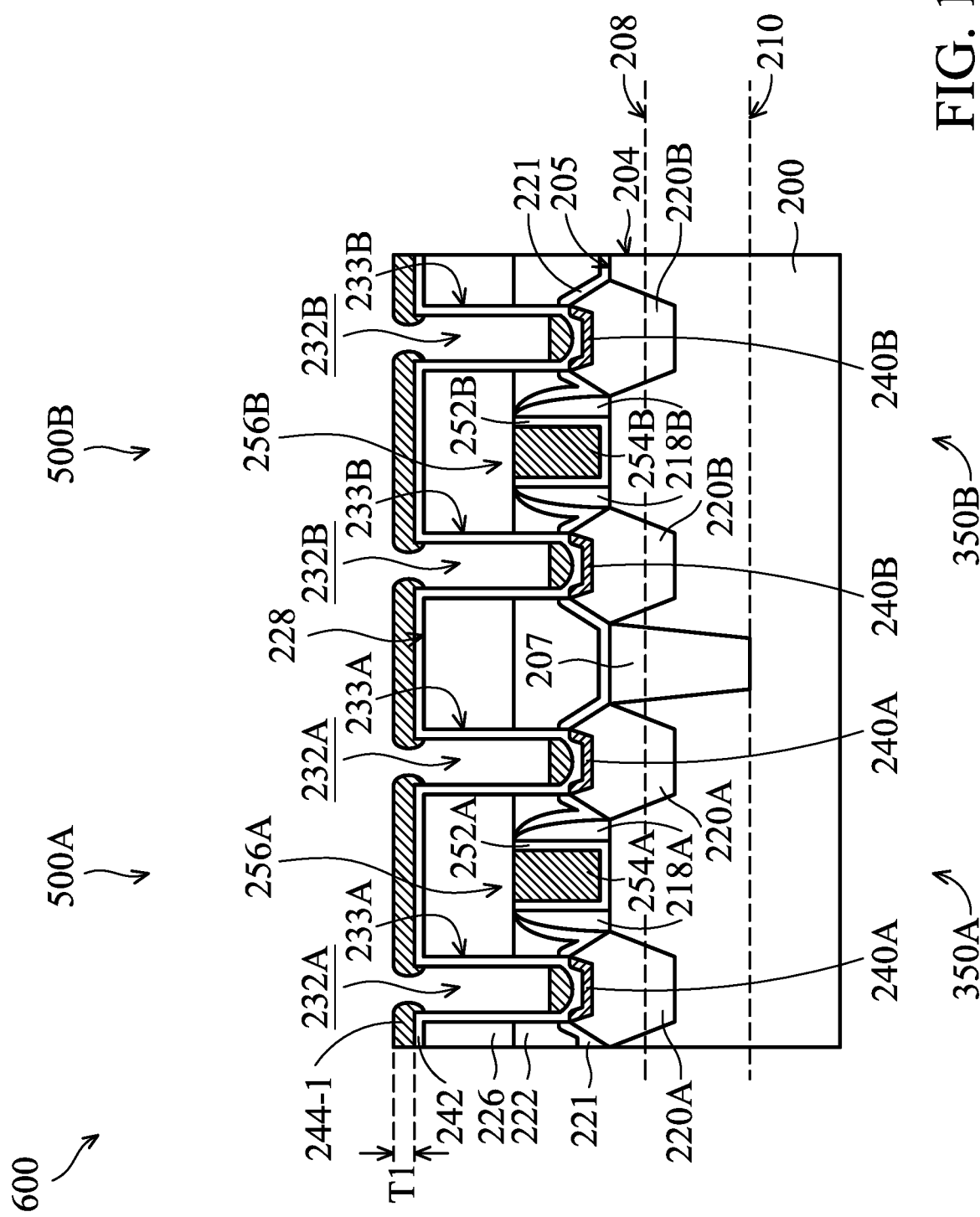

As shown in FIG. 1C, the glue layer material 242 may be conformally formed over the source/drain silicide layers 240A and 240B. In addition, the glue layer material 242 may line a sidewall surface 233A and a bottom of the opening 232A and a sidewall surface 233B and a bottom of the opening 232B.

In some embodiments, the glue layer material 242 is formed by deposition processes. The glue layer material 242 may include an electrically conductive material such as titanium (Ti), titanium nitride (TiN), tantalum (Ta), tantalum nitride (TaN), or the like, and may be formed by a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used.

Afterward, a wetting layer 244-1 is deposited over portions of the glue layer material 242, as shown in FIG. 1C in accordance with some embodiments. The portions of the glue layers 242A and 242B, which are located directly over the top surface 228 of the dielectric layer 226 and directly over the source/drain structures 220A and 220B, are covered by the wetting layer 244-1. The wetting layer 244-1 may be as thin as possible to allow more space for the subsequent deposited metal material to reflow into the openings 232A and 232B with high aspect ratio. In addition, the wetting layer 244-1 may provide a desirable wetting effect and create good adhesion between the glue layer material 242 and the metal material of the subsequently-formed contact plug. For example, the wetting layer 244-1 may have a high affinity with the metal material configured to form contact plugs. Because the wetting layer 244-1 is a thin layer, the wetting layer 244-1 may not line the sidewall surfaces 233A and 233B of the openings 232A and 232B.

In some embodiments, the wetting layer 244-1 is formed of the same metal material as the metal material configured to form the contact plugs. For example, the wetting layer 244-1 may be formed of cobalt (Co). In some other embodiments, the wetting layer 244-1 is made of a conductive material, such as copper (Cu), aluminum (Al), tungsten (W), titanium (Ti), titanium nitride (TiN), tantalum (Ta), tantalum nitride (TaN), or another applicable material. The wetting layer 244-1 may be formed by any suitable deposition method, such as PVD, CVD, ALD, plating (e.g. electroplating). The thickness T1 of the wetting layer 244-1 may be in a range from about 80 Å to about 100 Å, such as about 90 Å.

Figure 1D:
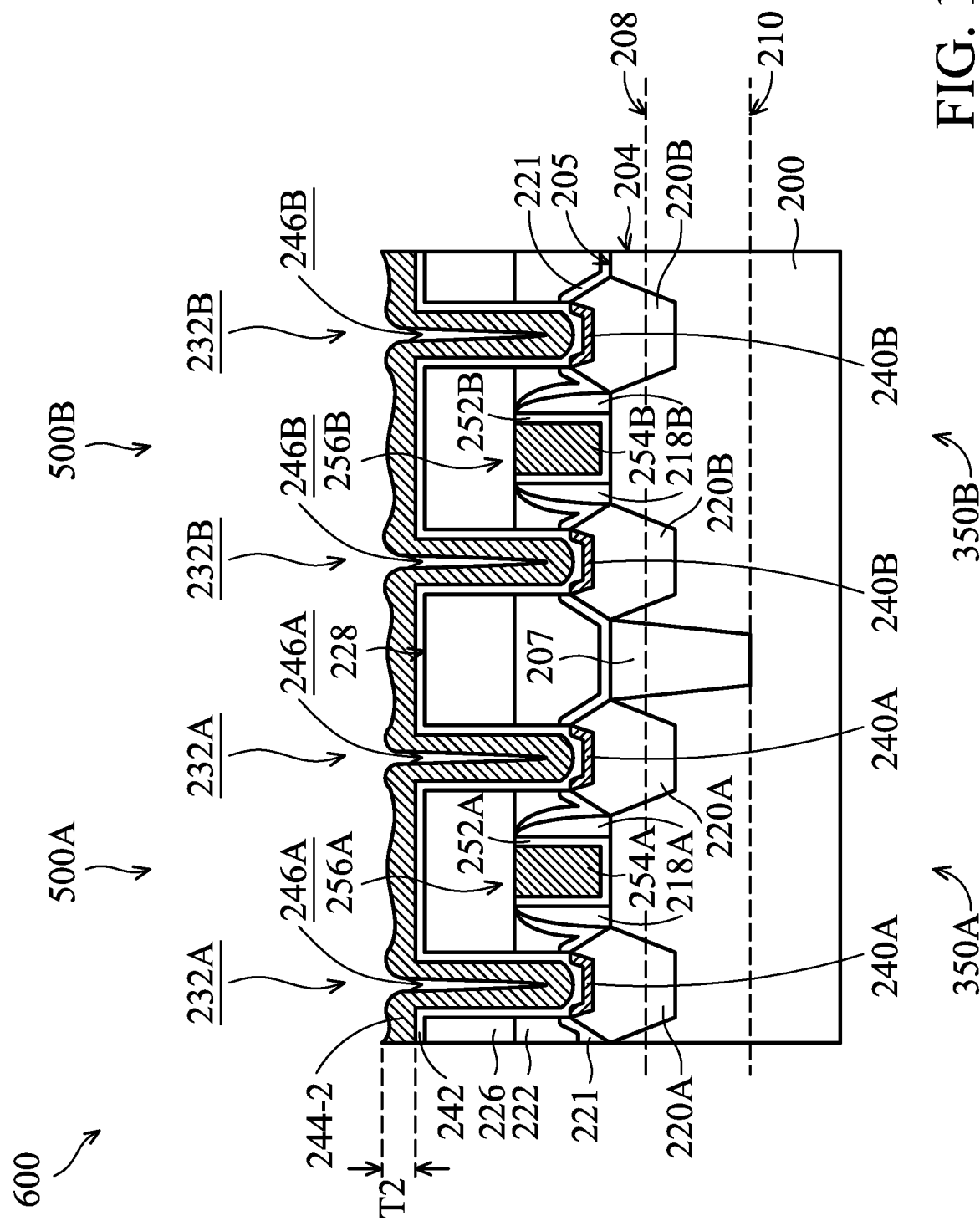

Afterward, a metal material 244-2 is formed to partially fill the openings 232A and 232B, as shown in FIG. 1D in accordance with some embodiments. In some embodiments, a deposition process is performed to deposit a metal material (not shown) configured to form the contact plugs over the wetting layer 244-1. In addition, the metal material and the wetting layer 244-1 may be formed of the same metal material. Therefore, the metal material and the wetting layer 244-1 may collectively form the metal material 244-2. As shown in FIG. 1D, the metal material 244-2 is formed with slits 246A and 246B positioned in the metal material 244-2 in the openings 232A and 232B.

In some embodiments, the metal material 244-2 is formed of the same metal material as the metal material configured to form the contact plugs. For example, the metal material 244-2 may be formed of cobalt (Co). In some other embodiments, the metal material 244-2 is made of a conductive material, such as copper (Cu), aluminum (Al), tungsten (W), titanium (Ti), titanium nitride (TiN), tantalum (Ta), tantalum nitride (TaN), or another applicable material. The metal material 244-2 may be formed by any suitable deposition method, such as PVD, CVD, ALD, plating (e.g. electroplating). The thickness T2 of the metal material 244-2 may be in a range from about 200 Å to about 400 Å, such as about 350 Å.

Figure 1E:
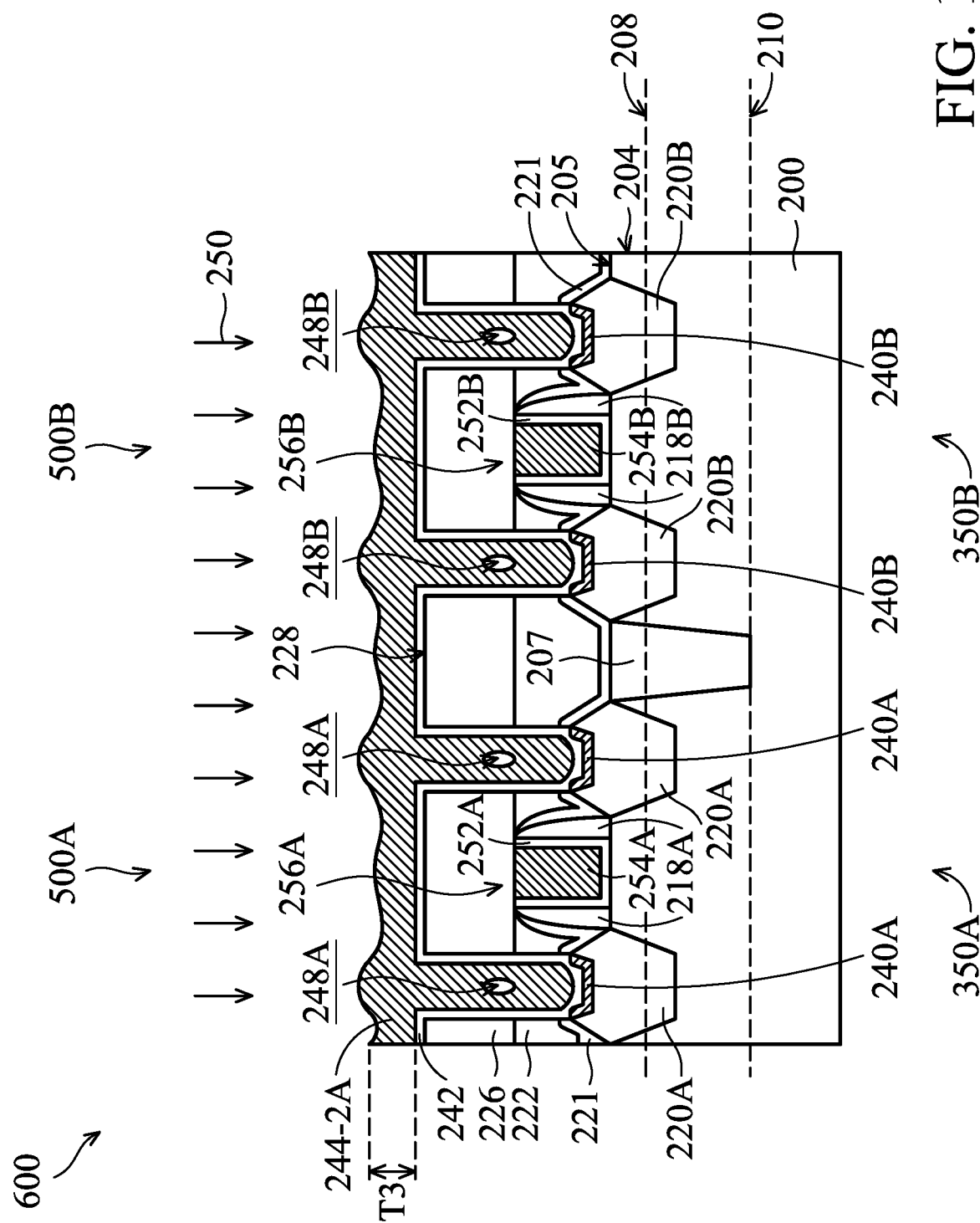

Afterward, a reflow process 250 is performed to reflow the metal material 244-2 into a metal material 244-2A, as shown in FIG. 1E in accordance with some embodiments. The metal material 244-2 positioned overlying the top surface 208 of the dielectric layer 226 may flow into the openings 232A and 232B. Therefore, the metal material 244-2 around the slits 246A and 246B (FIG. 1D) may be partially merged to form voids 248A and 248B in the metal material 244-2A after performing the reflow process 250. In some other embodiments, the metal material 244-2A is formed free from voids within. In addition, the metal material 244-2A may have a denser structure than the metal material 244-2 (FIG. 1D).

In some embodiments, the reflow process 250 is performed at a temperature in a range from about 350° C. to about 500° C., such as about 420° C. In addition, the reflow process 250 may be performed for a time in a range from about 500 seconds to about 700 seconds, such as about 600 seconds. In some embodiments, the thickness T3 of the reflowed metal material 244-2A is less than the thickness T2 of the metal material 244-2.

Figure 1F:
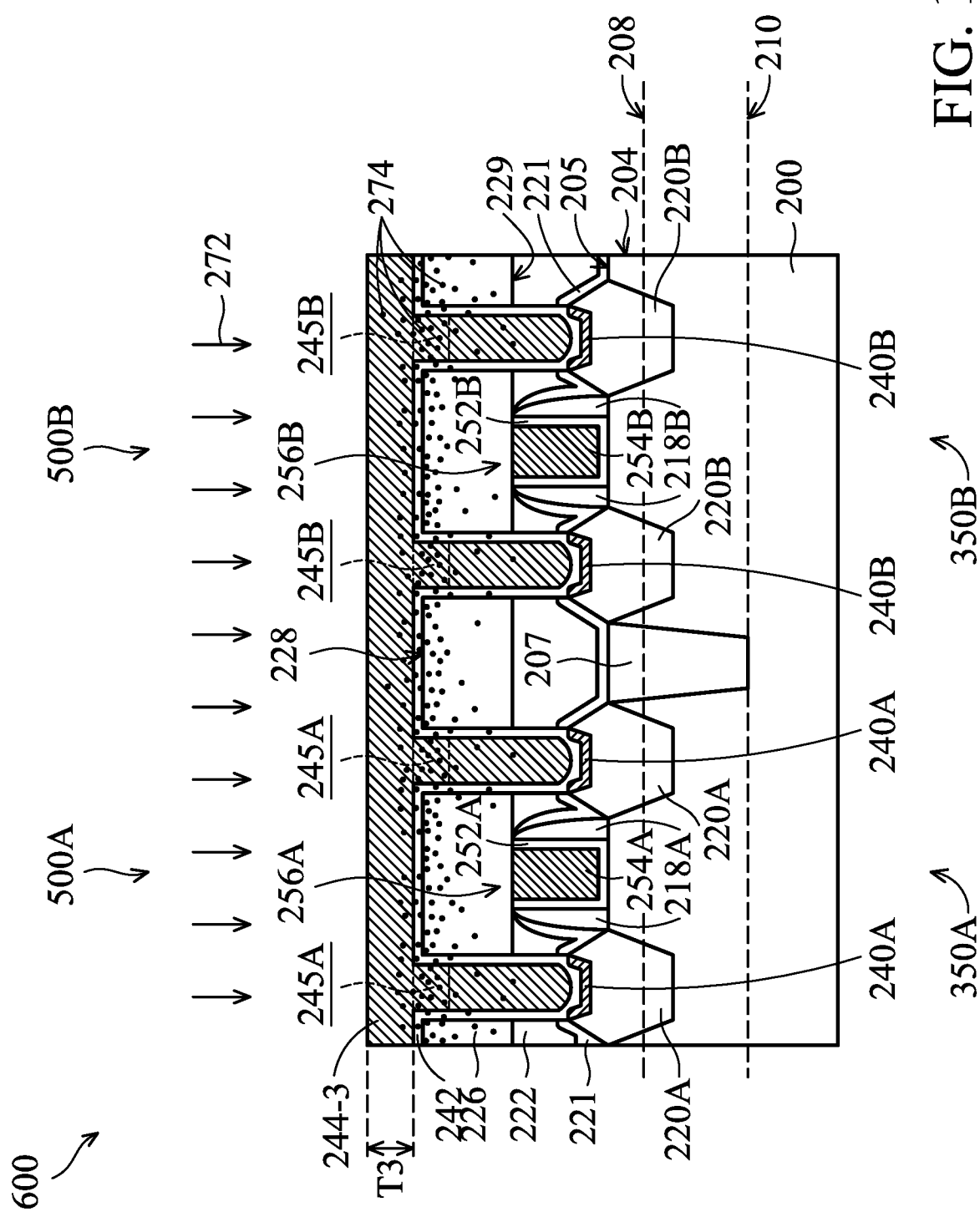

Afterward, a metal material 244-3 is formed over the top surface 228 of the dielectric layer 226 and filling the openings 232A and 232B, as shown in FIG. 1F in accordance with some embodiments. In some embodiments, another deposition process is performed to deposit a metal material (not shown) configured to form the contact plugs over the metal material 244-2A (FIG. 1E). In addition, the metal material and the metal material 244-2A may be formed of the same metal material. Therefore, the metal material and the metal material 244-2A may collectively form the metal material 244-3. As shown in FIG. 1F, the metal material 244-3 may be formed without slits or voids within.

In some embodiments, the metal material 244-3 is formed of the same metal material as the metal material configured to form the contact plugs. For example, the metal material 244-2 may be formed of cobalt (Co). In some other embodiments, the metal material 244-2 is made of a conductive material, such as copper (Cu), aluminum (Al), tungsten (W), titanium (Ti), titanium nitride (TiN), tantalum (Ta), tantalum nitride (TaN), or another applicable material. The metal material 244-3 may be formed by any suitable deposition method, such as PVD, CVD, ALD, plating (e.g. electroplating). The thickness T3 of the metal material 244-3 may be in a range from about 1400 Å to about 1800 Å, such as about 1500 Å.

Afterwards, an implantation process 272 is performed to implant a dopant 274 into the metal material 244-3, as shown in FIG. 1F in accordance with some embodiments. Therefore, the metal material 244-3 may include the dopant 274 after performing the implantation process 272. In some embodiments, the dopant 274 includes group III elements, group IV elements, group V elements or a combination thereof. For example, the dopant 274 includes boron (B), carbon (C), silicon (Si) or germanium (Ge), nitride (N), phosphorus (P) or a combination thereof. Therefore, the dopant 274 may serve as a non-metal dopant. The dopant 274 may react with the metal ions in the metal material 244-3 to form a first compound after performing the implantation process 272. The first compound may include group III elements, group IV elements, group V elements or a combination thereof. For example, when the metal material 244-3 is cobalt (Co), the first compound may include cobalt boron (CoB), cobalt germanium (CoGe), cobalt carbide (CoC), cobalt silicide (CoSi), cobalt nitride (CoN), cobalt phosphide (CoP), boron oxide ($B_2O_3$) or a combination thereof. For example, the first compound may include a metal compound. In some embodiments, the first compound (e.g. CoB, CoGe, CoC, CoSi, CoN, CoP, $B_2O_3$ and etc.) in the metal material 244-3 may help to densify the structure of the metal material 244-3. Therefore, the mechanical strength of the metal material 244-3 with the dopant 274 may be improved. In addition, the first compound formed by the metal material 244-3 and the dopant 274 may protect the metal material 244-3 from corrosion.

In some embodiments, the maximum concentration of the dopant 274 in the metal material 244-3 is located at a position close to the top surface 228 of the dielectric layer 226 after implanting the dopant 274 into the metal material 244-3 (i.e. after performing the implantation process 272). For example, the maximum concentration of the dopant 274 in the metal material 244-3 may be located between the top surface 228 and a bottom surface 229 of the dielectric layer 226. Therefore, portions of the metal material 244-3 around the top surface 228 of the dielectric layer 226 having high percentage of the first compound may serve as protective portions 245A and 245B. For example, the protective portions 245A of the metal material 244-3 are respectively positioned over the source/drain structures 220A, and the protective portions 245B of the metal material 244-3 are respectively positioned over the source/drain structures 220B.

In some embodiments, the dopant 274 is implanted into the glue layer material 242 during the implantation process 272 shown in FIG. 1F. Therefore, the glue layer material 242 may include the dopant 274 after performing the implantation process 272. The dopant 274 may react with the metal ions in the glue layer material 242 to form a second compound after performing the implantation process 272. The second compound may include group III elements, group IV elements, group V elements or a combination thereof. For example, when the glue layer material 242 is titanium (Ti), the second compound may include titanium boride (TiB), titanium nitride (TiN), titanium phosphide (TiP), titanium carbide (TiC), titanium silicide (TiSi), titanium germanium (TiGe) or a combination thereof. For example, the second compound may include a metal compound.

In some embodiments, the maximum concentration of the dopant 274 in the glue layer material 242 is located at a position close to the top surface 228 of the dielectric layer 226 after performing the implantation process 272.

In some embodiments, the dopant 274 is implanted into the dielectric layer 226, during the implantation process 272 shown in FIG. 1F. Therefore, the dielectric layer 262 may include the dopant 274 after performing the implantation process 272. The dopant 274 may react with the dielectric layer 226 to form a third compound after performing the implantation process 272. The third compound may include group III elements, group IV elements, group V elements or a combination thereof. For example, when the dielectric layer 226 is silicon dioxide ($SiO_2$), the third compound may include boron oxide ($B_2O$, $B_2O_3$), carbon dioxide ($CO_2$), silicon dioxide ($SiO_2$), silicon oxynitride (SiON), germanium dioxide ($GeO_2$), phosphorus oxide ($P_2O_5$) or a combination thereof. For example, the third compound may include a non-metal compound.

In some embodiments, the maximum concentration of the dopant 274 in the dielectric layer 226 is located at a position close to the top surface 228 of the dielectric layer 226 after performing the implantation process 272.

In some embodiments, the implantation process 272 is performed with an implantation energy in a range from about 10 KeV to about 80 KeV. In some embodiments, the dosage of the dopant 274 may be in a range from about 5E13 atoms/$cm^2$ to about 5E16 atoms/$cm^2$. In some embodiments, the implantation process 272 is performed at a temperature in a range from about −60° C. to about 450° C., such as about 25° C. (i.e. the room temperature).

Figure 1G:
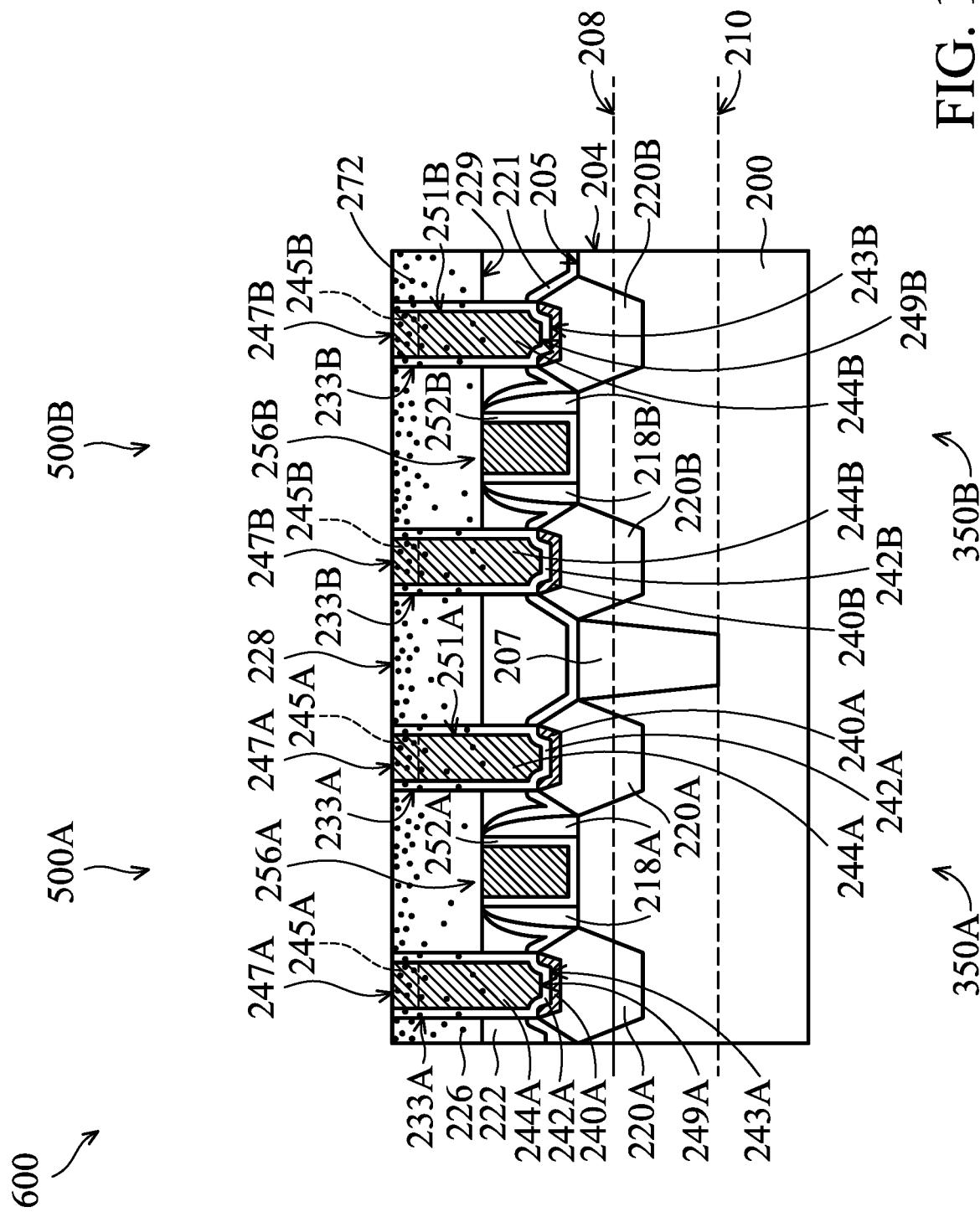

Afterwards, a portion of the metal material 244-3 and a portion of the glue layer material 242 above the top surface 228 of the dielectric layer 226 are removed to form glue layers 242A and 242B and contact plugs 244A and 244B by a planarization process, as shown in FIG. 1G in accordance with some embodiments. In addition, the protective portions 245A and 245B are positioned close to top surfaces of the contact plugs 244A and 244B after performing the planarization process.

In some embodiments, the planarization process, such as chemical mechanical polish (CMP), may be performed to level the top surface of the metal material 244-3 (FIG. 1F) with the top surface 228 of the dielectric layer 226. Therefore, the top surface 228 of the dielectric layer 226 may be level with top surfaces 247A and 247B of the contact plugs 244A and 244B. In addition, the bottom surface 229 of the dielectric layer 226 may be positioned between the top surfaces 247A and 247B and bottom surfaces 249A and 249B of the contact plugs 244A and 244B.

In some embodiments, the glue layers 242A and 242B are formed covering sidewall surfaces of the openings 232A and 232B (FIG. 1C). The glue layers 242A and 242B are formed covering the source/drain structures 220A and 220B in the openings 232A and 232B (FIG. 1C). For example, the glue layer 242A may be conformally formed over the source/drain structures 220A and lines a sidewall surface 233A and a bottom of the opening 232A (FIG. 1C). The glue layer 242B may be conformally formed over the source/drain structures 220B and lines a sidewall surface 233B and a bottom of the opening 232B (FIG. 1C). In addition, bottom surfaces 243A and 243B of the glue layers 242A and 242B are respectively in direct contact with the source/drain silicide layers 240A and 240B. Furthermore, the bottom surfaces 243A and 243B of the glue layers 242A and 242B may be respectively level with or lower than top surfaces of the source/drain structures 220A and 220B.

In some embodiments, the contact plugs 244A and 244B are formed filling the openings 232A and 232B (FIG. 1C). For example, the contact plugs 244A and 244B may be formed passing through the dielectric layers 222 and 226. The contact plugs 244A and 244B may be surrounded by the glue layers 242A and 242B, respectively. In addition, the contact plugs 244A and 244B may be surrounded by the dielectric layers 222 and 226. Furthermore, the contact plug 244A may be formed over the source/drain structure 220A. The contact plug 244B may be formed over the source/drain structure 220B. Moreover, the contact plugs 244A and 244B may be electrically connected to the source/drain structures 220A and 220B through the glue layers 242A and 242B, respectively. The glue layers 242A and 242B may cover bottom surfaces 249A and 249B and sidewall surfaces 251A and 251B of the contact plugs 244A and 244B. As shown in FIG. 1G, the contact plugs 244A and 244B may serve as source/drain contact plugs.

In some embodiments, the contact plugs 244A and 244B include the dopant 274 including group III elements, group IV elements, group V elements or a combination thereof. In some embodiments, the concentration of the dopant 274 in the contact plugs 244A and 244B gradually decreases from the top surfaces 247A and 247B to the bottom surfaces 249A and 249B of the contact plugs 244A and 244B. In addition, the first compound (e.g. CoB, CoGe, CoC, CoSi, CoN, CoP, $B_2O_3$ and etc.), which may serve as a first metal compound, in the contact plugs 244A and 244B may gradually decrease from the top surfaces 247A and 247B to the bottom surfaces 249A and 249B of the contact plugs 244A and 244B.

For example, the glue layers 242A and 242B may include the dopant 274 including group III elements, group IV elements, group V elements or a combination thereof. Furthermore, the concentration of the dopant 274 in the glue layers 242A and 242B may be gradually decreased from the top surfaces to the bottom surfaces of the glue layers 242A and 242B. In addition, the second compound (e.g. TiB, TiN, TiP, TiC, TiSi, TiGe and etc.), which may serve as a second metal compound, in the glue layers 242A and 242B may gradually decrease from the top surfaces to the bottom surfaces of the glue layers 242A and 242B. Further, the second metal compound in the glue layers 242A and 242B may be different form the first metal compound in the contact plugs 244A and 244B.

For example, the dielectric layer 226 may include the dopant 274 including group III elements, group IV elements, group V elements or a combination thereof. In addition, the concentration of the dopant 274 in the dielectric layer 226 may be gradually decreased from the top surface 228 to the bottom surface 229 of the dielectric layer 226. In addition, the third compound (e.g. $B_2O$, $B_2O_3$, $CO_2$, $SiO_2$, SiON, $GeO_2$, $P_2O_5$ and etc.), which may serve as a non-metal compound, in the dielectric layer 226 may gradually decrease from the top surface 228 to the bottom surface 229 of the dielectric layer 226.

As shown in FIG. 1G, the protective portions 245A and 245B may serve as top portions of the contact plugs 244A and 244B. The first metal compound in the protective portions 245A and 245B may increase the hardness (or the mechanical strength) of the contact plugs 244A and 244B. In addition, the protective portions 245A and 245B may protect the contact plugs 244A and 244B from corrosion. Therefore, the CMP slurry and $H_2O$ (e.g. deionized (DI) water) spray used in the planarization process (e.g. the CMP process) of the contact plugs 244A and 244B may not attack the contact plugs 244A and 244B and result in the loss of the contact plugs 244A and 244B.

Figure 1H:
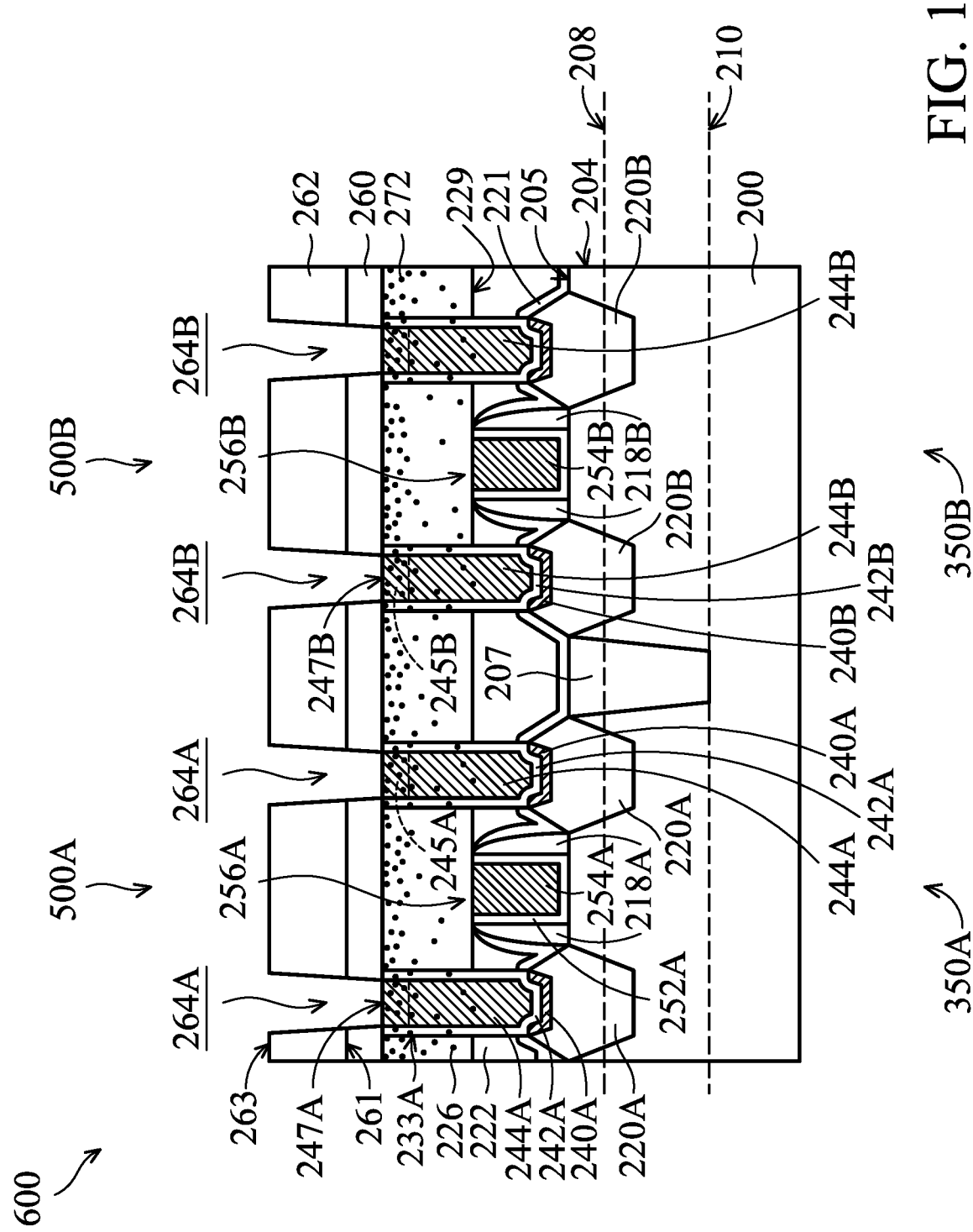

Afterwards, an etching stop layer (ESL) 260 is formed on the dielectric layer 226, as shown in FIG. 1H in accordance with some embodiments. The etching stop layer 260 may be formed overlying the glue layers 242A and 242B and the contact plugs 244A and 244B. The etching stop layer 260 may be a single layer or multiple layers. The etching stop layer 260 is made of silicon carbide (SiC), silicon nitride (SixNy), silicon carbonitride (SiCN), silicon oxycarbide (SiOC), silicon oxycarbon nitride (SiOCN), silicon oxide (SiOx) or another applicable material. In some embodiments, the etching stop layer 260 is formed by performing a plasma enhanced chemical vapor deposition (CVD) process, a low pressure CVD process, an atomic layer deposition (ALD) process, or another applicable process.

Afterwards, a dielectric layer 262 (such as an inter-metal dielectric (IMD) layer) is formed over the contact plugs 244A and 244B, as shown in FIG. 1H in accordance with some embodiments. In addition, the dielectric layer 262 may be formed overlying the etching stop layer 260. The dielectric layer 262 may be a single layer or multiple layers. In some embodiments, the dielectric layer 262 is made of silicon oxide. In some other embodiments, the dielectric layer 262 is made of un-doped silicate glass (USG), fluorinated silicate glass (FSG), carbon-doped silicate glass, silicon nitride or silicon oxynitride.

In some embodiments, the dielectric layer 262 includes an extreme low-k (ELK) dielectric layer. ELK dielectric layer is made of ELK dielectric material which has a dielectric constant (k) less than about 2.5. ELK dielectric materials may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials are made of a material including a porous version of an existing dielectric material, such as hydrogen silsesquioxane (HSQ), porous methyl silsesquioxane (MSQ), porous polyarylether (PAE), porous SiLK, or porous silicon dioxide ($SiO_2$). In some embodiments, ELK dielectric material is deposited by a plasma enhanced chemical vapor deposition (PECVD) process or by a spin coating process.

Afterwards, openings 264A and 264B are formed in the dielectric layer 262 to expose the top surfaces 247A and 247B of the contact plugs 244A and 244B by a patterning process, as shown in FIG. 1H in accordance with some embodiments. The patterning process is performed to remove portions of the dielectric layer 262 and the ESL 260 and to stop on the contact plugs 244A and 244B. Therefore, the openings 264A and 264B may be formed passing through the dielectric layer 262 and the ESL 260.

In some embodiments, the patterning process includes a photolithography process and a subsequent etching process. The photolithography process may include photoresist coating (e.g. spin-on coating), soft baking, mask aligning, exposure, post-exposure baking, developing the photoresist, rinsing and drying (e.g. hard baking). The etching process may include a dry etching process or a wet etching process. In some embodiments, the etching process is a dry etching process. In addition, etching gases used in the etching process include fluorine-containing (F-containing) gases. After the openings 264A and 264B are formed, the photoresist (not shown) may be removed by etching or any other suitable method.

Figure 1I:
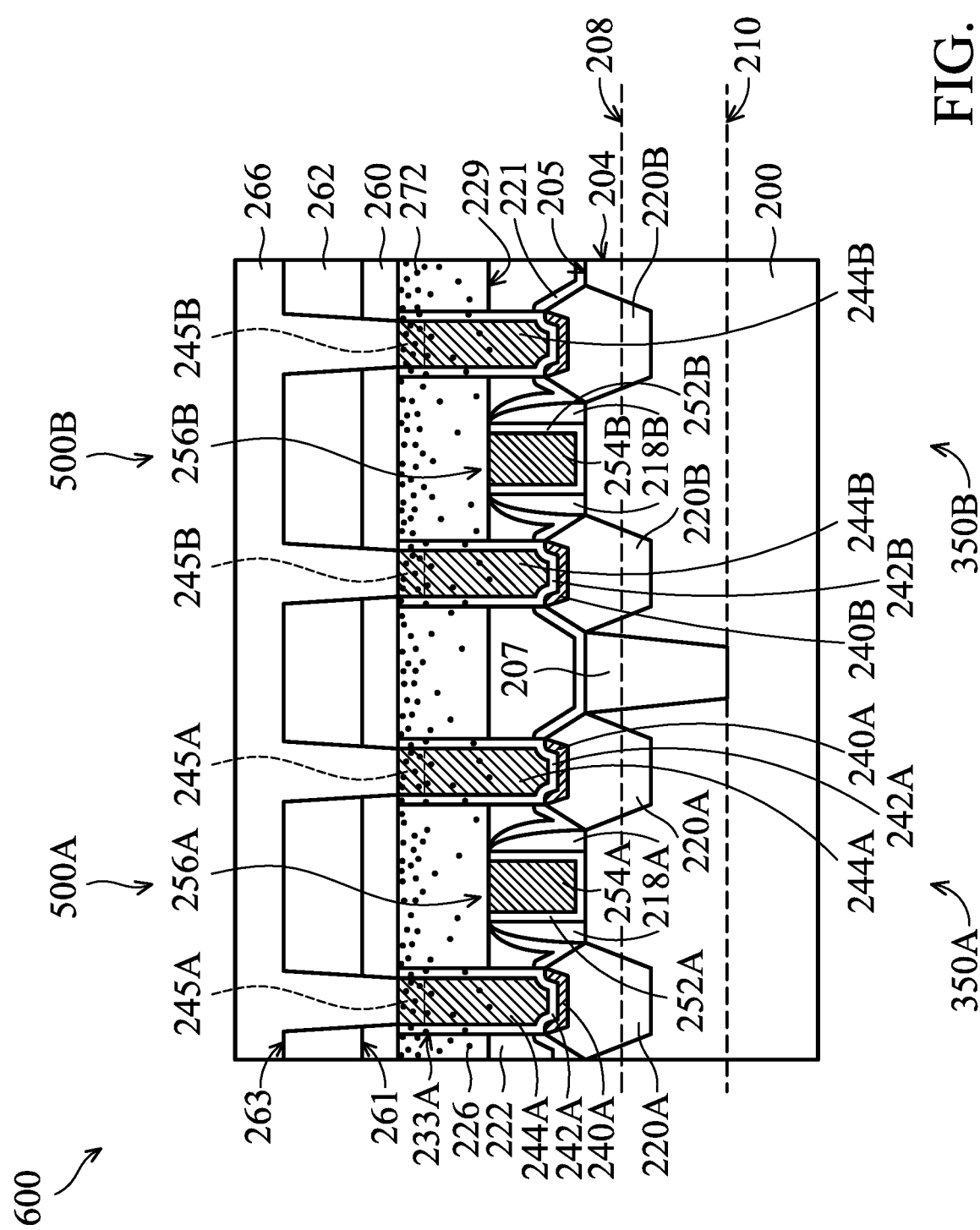

Afterwards, a metal material 266 is deposited over the dielectric layer 262 and filling the openings 264A and 264B (FIG. 1H), as shown in FIG. 1I in accordance with some embodiments. In addition, the metal material 266 is formed overlying a top surface 263 of the dielectric layer 262. In some embodiments, the metal material 266 is made of tungsten (W). In some other embodiments, the metal material 266 is made of cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another applicable material. In some embodiments, the metal material 266 is formed by any suitable deposition method, such as PVD, CVD, ALD, or plating (e.g. electroplating).

In some embodiments, a cleaning process, such as a plasma cleaning process, may be performed on the top surfaces 247A and 247B of the contact plugs 244A and 244B before depositing the metal material 266. In some embodiments, the plasma cleaning process may be performed using a process gas including $H_2$. Therefore, the plasma cleaning process may include a $H_2$ plasma cleaning process. Because the cobalt-containing compound (i.e. the first compound) in the protective portions 245A and 245B may have an improved mechanical strength, the cleaning process may not attack the contact plugs 244A and 244B. Therefore, the contact plug loss problem may be eliminated during the cleaning process prior to the via plug material deposition process.

Figure 1J:
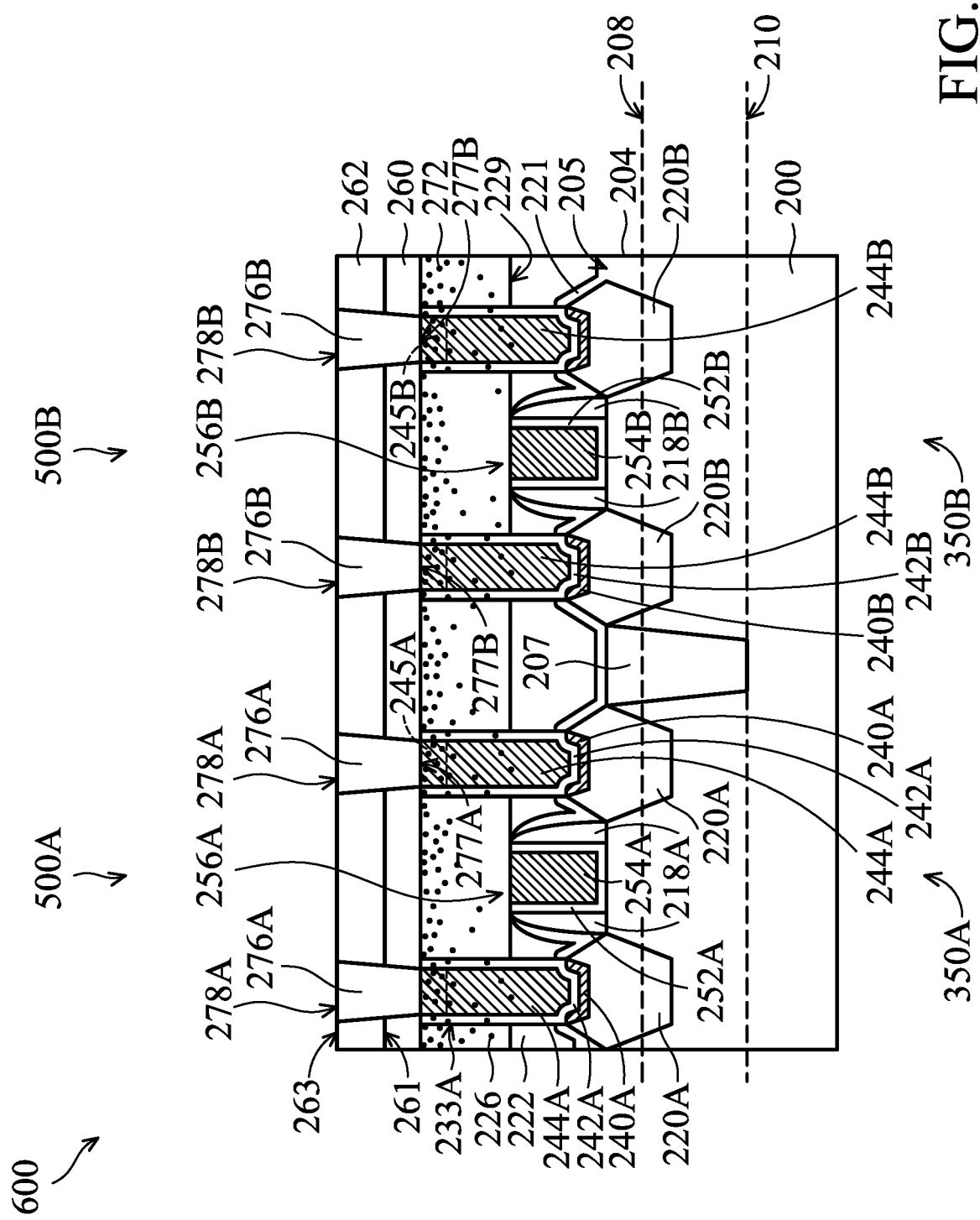

Afterwards, a portion of the metal material 266 (FIG. 1I) above the top surface 263 of the dielectric layer 262 is removed to form via plugs 276A and 276B, as shown in FIG. 1J in accordance with some embodiments. The via plugs 276A and 276B may be formed over the contact plugs 244A and 244B, respectively. In addition, the via plugs 276A and 276B may be in contact with the top surface 274A and 274B of the contact plugs 244A and 244B, respectively.

A planarization process, such as chemical mechanical polish (CMP), may be performed to level the top surface of the metal material 266 with the top surface 263 of the dielectric layer 262. Therefore, the via plugs 276A and 276B are formed passing through the dielectric layer 262 and the etching stop layer 260. The via plugs 276A and 276B are surrounded by the dielectric layer 262. The top surface 263 of the dielectric layer 262 may be aligned with top surfaces 278A and 278B of the via plugs 276A and 276B. In addition, the bottom surface 261 of the dielectric layer 262 may be positioned between the top surfaces 278A and 278B and bottom surfaces 277A and 277B of the via plugs 276A and 276B. Moreover, the bottom surfaces 277A and 277B of the via plugs 276A and 276B are in contact with the top surfaces 274A and 274B of the contact plugs 244A and 244B, respectively.

After performing the aforementioned processes, the FinFET 500A is formed over the fin structure 204A in the first region 350A and the FinFET 500B is formed over the fin structure 204B in the second region 350B. Moreover, a semiconductor structure 600 including the FinFET 500A (e.g. the N-type FinFET) and the FinFET 500B e.g. the P-type FinFET) is formed, as shown in FIG. 1J in accordance with some embodiments.

In some embodiments, the semiconductor structure 600 includes the contact plugs 244A and 244B implanted with the dopant 274. The dopant 274 may be a non-metal dopant including group III elements, group IV elements, group V elements or a combination thereof. The dopant 274 may react with the contact plugs 244A and 244B to form the first compound including CoB, CoGe, CoC, CoSi, CoN, CoP, $B_2O_3$ or a combination thereof. In addition, the first compound in the contact plugs 244A and 244B may gradually decrease from the top surfaces 247A and 247B to the bottom surfaces 249A and 249B of the contact plugs 244A and 244B. Therefore, portions of the contact plugs 244A and 244B close to the top surfaces 247A and 247B may have a high percentage of the first compound and may serve as protective portions 245A and 245B of the contact plugs 244A. The first metal compound in the protective portions 245A and 245B may increase the hardness (or the mechanical strength) of the contact plugs 244A and 244B. Therefore, the protective portions 245A and 245B may prevent the CMP slurry (or $H_2O$ spray) from attacking the contact plugs 244A and 244B. In addition, the protective portions 245A and 245B may prevent the plasma cleaning process (prior to the via plug material deposition process) from damaging the contact plugs 244A and 244B. Therefore, the contact plug loss problem of the contact plugs may be eliminated during the planarization process (e.g. the Co CMP process) of the contact plugs 244A and 244B or during the cleaning process prior to the via plug material deposition process. The problem of increasing contact plug resistance may be improved.

As described previously, the semiconductor structure (e.g. the semiconductor structures 600) includes the contact plugs (e.g. the contact plugs 244A and 244B) includes a first compound (e.g. $B_2O$, $B_2O_3$, $CO_2$, $SiO_2$, SiON, $GeO_2$, $P_2O_5$ and etc.) comprising one of group III elements, group IV elements, group V elements or a combination thereof. Therefore, the structure of the contact plugs may be densified. The contact plugs may have improved mechanical strength. The contact plug loss problem of the contact plugs may be eliminated during the planarization process of the contact plug or during the cleaning process prior to the via plug material deposition process. The problem of increasing contact plug resistance may be improved.

Embodiments of a semiconductor structure and a method for forming the same are provided. The semiconductor structure includes a gate structure, a source/drain structure, a dielectric layer, a contact plug. The dielectric layer is positioned over the gate structure and the source/drain structure. The contact plug is positioned passing through the dielectric layer. The contact plug includes a first metal compound including one of group III elements, group IV elements, group V elements or a combination thereof. The first metal compound may help to densify the structure of the contact plug. Therefore, the contact plug loss problem may be eliminated during the planarization process of the contact plug or during the cleaning process prior to the via plug material deposition process.

In some embodiments, a semiconductor structure is provided. The semiconductor structure includes a gate structure, a source/drain structure, a dielectric layer, a contact plug. The gate structure is positioned over a fin structure. The source/drain structure is positioned in the fin structure and adjacent to the gate structure. The dielectric layer is positioned over the gate structure and the source/drain structure. The contact plug is positioned passing through the dielectric layer. The contact plug includes a first metal compound including one of group III elements, group IV elements, group V elements or a combination thereof.

In some embodiments, a semiconductor structure is provided. The semiconductor structure includes a gate structure, a source/drain structure, a contact plug and a glue layer. The gate structure is positioned over a fin structure. The source/drain structure is positioned in the fin structure and adjacent to the gate structure. The contact plug is positioned over the source/drain structure. The contact plug comprises a non-metal dopant comprising one of group III elements, group IV elements, group V elements or a combination thereof.

In some embodiments, a method for forming a semiconductor structure is provided. The method includes forming a gate structure over a fin structure. The method includes forming a source/drain structure in the fin structure and adjacent to the gate structure. The method further includes forming a dielectric layer over the source/drain structure. The method further includes forming an opening in the dielectric layer to expose the source/drain structure. The method further includes depositing a metal material to fill the opening. The method further includes performing an implantation process to implant a dopant including one of group III elements, group IV elements, group V elements or a combination thereof into the metal material. The method further includes removing a portion of the metal material above a top surface of the dielectric layer to form a contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a gate structure over a fin structure;
    a source/drain structure in the fin structure and adjacent to the gate structure;
    a dielectric layer over the gate structure and the source/drain structure;
    a contact plug passing through the dielectric layer; and
    a glue layer covering a bottom surface and a sidewall surface of the contact plug,
    wherein the contact plug comprises a first metallic compound comprising one of group III elements, group IV elements, group V elements or a combination thereof, wherein the dielectric layer has a top surface aligned with a top surface of the contact plug and a bottom surface higher than a bottom surface of the contact plug, wherein the glue layer is in contact with the dielectric layer, wherein the contact plug comprises a metal doped with a non-metal dopant, and a concentration of the first metallic compound in the contact plug decreases from a top surface to a bottom surface of the contact plug.

2. The semiconductor structure as claimed in claim 1, wherein the first metal compound comprises boron (B), carbon (C), silicon (Si) or germanium (Ge), nitride (N), phosphorus (P) or a combination thereof.

3. The semiconductor structure as claimed in claim 1, wherein the dielectric layer comprises a non-metal compound comprising one of group III elements, group IV elements, group V elements or a combination thereof.

4. The semiconductor structure as claimed in claim 3, wherein the concentration of the non-metal compound in the dielectric layer gradually decreases from the top surface to the bottom surface of the dielectric layer.

5. The semiconductor structure as claimed in claim 1, wherein the glue layer comprises a second metal compound comprising one of group III elements, group IV elements, group V elements or a combination thereof.

6. The semiconductor structure as claimed in claim 5, wherein the second metal compound is different from the first metal compound.

7. The semiconductor structure as claimed in claim 1, wherein the dielectric layer has a bottom surface substantially level with a top surface of the gate structure.

8. The semiconductor structure as claimed in claim 1, further comprising:
    a contact etch stop layer (CESL) over the gate structure and the source/drain structure, wherein a top surface of the dielectric layer is higher than a top surface of the contact etch stop layer.

9. The semiconductor structure as claimed in claim 8, further comprising:
    a source/drain silicide layer over the source/drain structure,
    wherein a portion of the source/drain structure is sandwiched between the source/drain silicide layer and the contact etch stop layer.

10. A semiconductor structure, comprising:
    a gate structure over a fin structure;
    a source/drain structure in the fin structure and adjacent to the gate structure;
    a source/drain silicide layer on the source/drain structure;
    a contact plug over the source/drain structure; and
    a glue layer covering a bottom surface and a sidewall surface of the contact plug,
    wherein the contact plug comprises a metal doped with a non-metal dopant comprising one of group III elements, group IV elements, group V elements, or a combination thereof, wherein the glue layer is in contact with the source/drain silicide layer.

11. The semiconductor structure as claimed in claim 10, wherein the contact plug comprises:
    a bottom surface overlying the source/drain structure; and
    a top surface in contact with a via plug, wherein the concentration of the non-metal dopant in the contact plug gradually decreases from the top surface to the bottom surface of the contact plug.

12. The semiconductor structure as claimed in claim 11, wherein the glue layer comprises the non-metal dopant, and wherein the concentration of the non-metal dopant in the glue layer decreases from the top surface to the bottom surface of the contact plug.

13. The semiconductor structure as claimed in claim 11, further comprising:
    a contact etch stop layer (CESL) over the gate structure and the source/drain structure and surrounding the contact plug; and
    a dielectric layer over the CESL and surrounding the contact plug, wherein the dielectric layer comprises the non-metal dopant.

14. The semiconductor structure as claimed in claim 13, wherein the concentration of the non-metal dopant in the dielectric layer gradually decreases from a top surface to a bottom surface of the dielectric layer, wherein the top surface of the dielectric layer is level with the top surface of the contact plug.

15. The semiconductor structure as claimed in claim 10, wherein the non-metal dopant comprises boron (B), carbon (C), silicon (Si), nitrogen (N), phosphorus (P) or a combination thereof.

16. The semiconductor structure as claimed in claim 10, wherein the contact plug and the source/drain structure are separated by the source/drain silicide layer and the glue layer.

17. A semiconductor structure, comprising:
    a gate structure on a fin structure;
    a source/drain structure on the fin structure and adjacent to the gate structure;
    a source/drain silicide layer on the source/drain structure;
    a dielectric layer covering the gate structure and the source/drain structure;
    a contact plug in the dielectric structure and over the source/drain silicide layer;
    a glue layer covering a bottom surface and a sidewall surface of the contact plug, wherein a hardness of a top portion of the contact plug is greater than a hardness of a bottom portion of the contact plug in contact with the source/drain silicide layer, and a bottom surface of the glue layer is lower than a top surface of the source/drain structure, wherein the contact plug comprises a metal doped with a non-metal dopant, and the contact plug comprises a first metal compound, and a concentration of the first metal compound in the top portion of the contact plug is higher than a concentration of the first metal compound in the bottom portion of the contact plug.

18. The semiconductor structure as claimed in claim 17, wherein the first metal compound contains a group III element, a group IV element, a group V element, or a combination thereof.

19. The semiconductor structure as claimed in claim 17, wherein the top portion of the contact plug is doped with boron (B), carbon (C), silicon (Si), germanium (Ge), nitrogen (N), phosphorus (P), or a combination thereof.

20. The semiconductor structure as claimed in claim 19, wherein the first metal compound comprises cobalt boron (CoB), cobalt germanium (CoGe), cobalt carbide (CoC), cobalt silicide (CoSi), cobalt nitride (CoN), cobalt phosphide (CoP), or a combination thereof.

* * * * *